United States Patent
Xia et al.

(10) Patent No.: US 8,063,802 B1
(45) Date of Patent: Nov. 22, 2011

(54) FILTER FOR ADJUSTING ADC SAMPLES

(75) Inventors: Haitao Xia, Mountain View, CA (US);
Yenyu Hsieh, San Jose, CA (US)

(73) Assignee: Link_A_Media Devices Corporation,
Santa Clara, CA (US)

( * ) Notice: Subject to any disclaimer, the term of this patent is extended or adjusted under 35 U.S.C. 154(b) by 0 days.

(21) Appl. No.: 12/661,994

(22) Filed: Mar. 26, 2010

Related U.S. Application Data

(60) Provisional application No. 61/211,753, filed on Apr. 1, 2009.

(51) Int. Cl.
*H03M 1/06* (2006.01)

(52) U.S. Cl. ........................................ 341/118; 341/155

(58) Field of Classification Search ................. 341/155, 341/118
See application file for complete search history.

(56) References Cited

U.S. PATENT DOCUMENTS

| | | | |
|---|---|---|---|
| 6,553,066 B1 * | 4/2003 | Pollet et al. ................... 375/232 |
| 7,061,409 B1 * | 6/2006 | Jantti et al. ...................... 341/61 |
| 7,068,584 B2 * | 6/2006 | Mouri et al. ................ 369/124.1 |
| 7,440,224 B2 * | 10/2008 | Ehrlich et al. ............. 360/77.08 |
| 7,733,591 B2 * | 6/2010 | Bottemiller et al. ........... 360/51 |
| 2007/0140088 A1 * | 6/2007 | Hino et al. ................. 369/59.22 |

* cited by examiner

*Primary Examiner* — Khai M Nguyen
(74) *Attorney, Agent, or Firm* — Van Pelt, Yi & James LLP

(57) ABSTRACT

Phase is adjusted by using an analog to digital converter to convert an analog signal to a plurality of digital samples. A filter is used to filter the plurality of digital samples to obtain a plurality of phase adjusted samples.

20 Claims, 10 Drawing Sheets

Example 1 (Prior to Gain & Phase Adjustment)

Example 2 (Prior to Gain & Phase Adjustment)

Example Output (After Gain & Phase Adjustment)

FILTER FOR ADJUSTING ADC SAMPLES

CROSS REFERENCE TO OTHER APPLICATIONS

This application claims priority to U.S. Provisional Patent Application No. 61/211,753 entitled DESIGN OF REPEATABLE RUNOUT CIRCUIT filed Apr. 1, 2009 which is incorporated herein by reference for all purposes.

BACKGROUND OF THE INVENTION

In some systems, an analog signal is converted to digital samples using an ADC. The frequency and/or phase at which the analog signal is sampled may be "off" and a variety of techniques are used to ensure the digital samples are taken at the proper frequency and/or phase. In one such system, a timing loop is used to adjust the phase and/or frequency of the sampling clock. One drawback to using a timing loop is that a minimum number of samples (cycles) is needed for the timing loop to operate properly. However, this may not be possible in all cases. For example, some applications or systems have a shorter preamble portion (e.g., prior to a payload section) than other applications. It would be desirable to develop techniques that are able to operate robustly in such applications.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
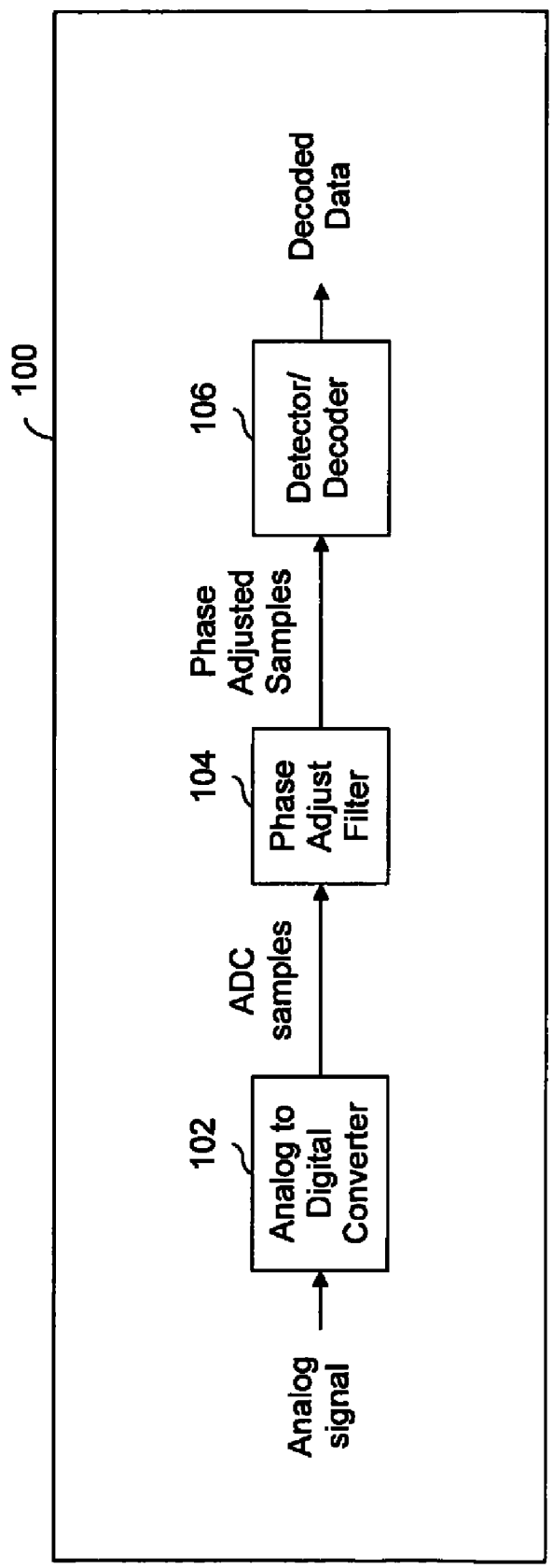
FIG. 1 is a diagram showing an embodiment of a system that includes a phase adjust filter.

FIG. 1 is a diagram showing an embodiment of a system that includes a phase adjust filter. In various embodiments, the example system shown is part of a read processor (e.g., in storage applications) or a receiver (e.g., in communications applications). System 100 includes analog to digital converter (ADC) 102 which converts an analog signal to digital samples. For example, in a storage application the analog signal is obtained by reading the storage media (e.g., a disk). ADC 100 outputs ADC samples which are passed to phase adjust filter 104. Phase adjust filter 104 is a filter which modifies or otherwise adjusts the phase and/or amplitude of the digital samples passed to it. For example, the system may be expecting or is configured to operate under the assumption that the ADC samples correspond to certain expected or desired phases. The phase adjusted samples output by phase adjust filter 104 are adjusted (if needed) to correspond to those desired or expected phases. For example, if the ADC samples passed to phase adjust filter are perfectly match an expected or desired phase then there is no adjustment and the phase adjusted samples output by phase adjust filter 104 match the ADC samples which are input to it.

In some embodiments, a phase adjusted sample generated by phase adjust filter 104 is based at least in part on one or more ADC samples. In some such embodiments, there is a sliding window of ADC samples from which a phase adjusted sample is obtained. Some examples are described in further detail below.

The phase adjusted samples are passed to detector/decoder 106. In some embodiments, data (e.g., written to storage media) is encoded (e.g., by a write processor) using one or more error correction and/or error detection codes. Detector/decoder 106 is configured appropriately to decode or otherwise process the particular code used. Some example codes include Reed-Solomon codes, convolutional codes, low-density parity-check (LDPC) codes, etc. Decoded data is output by detector/decoder 106. For example, in a storage application the decoded data may be passed to the application or other entity that requested data stored on storage media.

Figure 2:
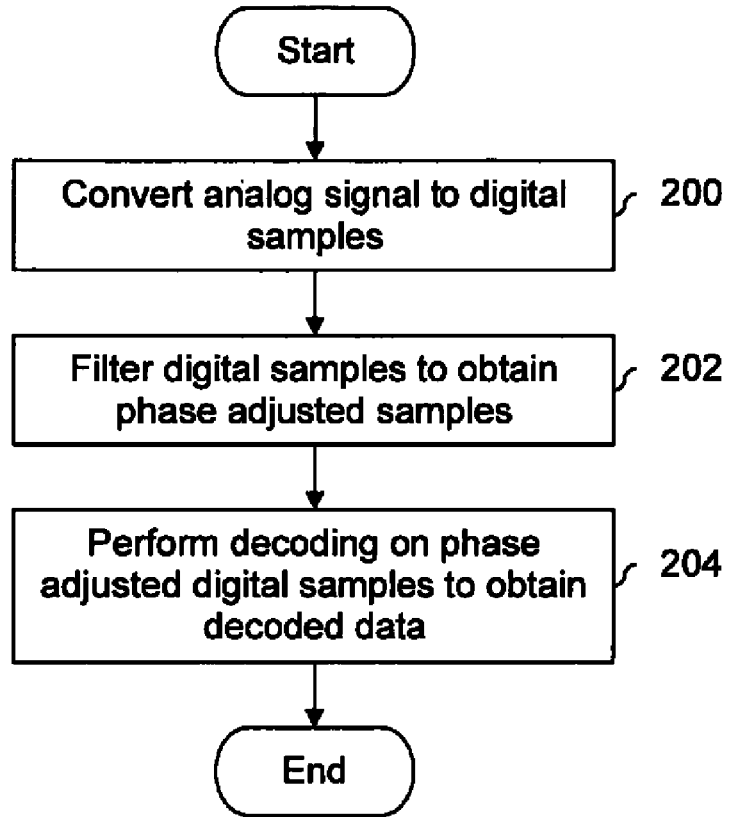
FIG. 2 is a flowchart illustrating an embodiment of a process for performing filtering for phase adjustment.

FIG. 2 is a flowchart illustrating an embodiment of a process for performing filtering for phase adjustment. In some embodiments, phase adjust filter 104 in FIG. 1 performs the process shown.

At 200, an analog signal is converted to digital samples. In some embodiments, the system assumes the write and read process use the same frequency. As a result, the frequency at which to sample the analog signal is known in such embodiments. In some embodiments, any frequency adjustment has already occurred and frequency adjustment is not necessary at this point.

Digital samples are filtered to obtain phase adjusted digital samples at 202. In some embodiments, filtering at 202 uses a finite impulse response (FIR) filter where a finite number of input samples contribute to the output. This is in contrast to infinite impulse response (IIR) filters which have an (internal) feedback loop and so an infinite number of input samples contribute to the output. Some examples of phase adjust filtering at 202 are described in further detail below. Decoding is performed on the phase adjusted digital samples to obtain decoded data at 204. For example, the data may be encoded using a Reed-Solomon code, an LDPC code, or some other code and appropriate decoding is performed.

Figure 3A:
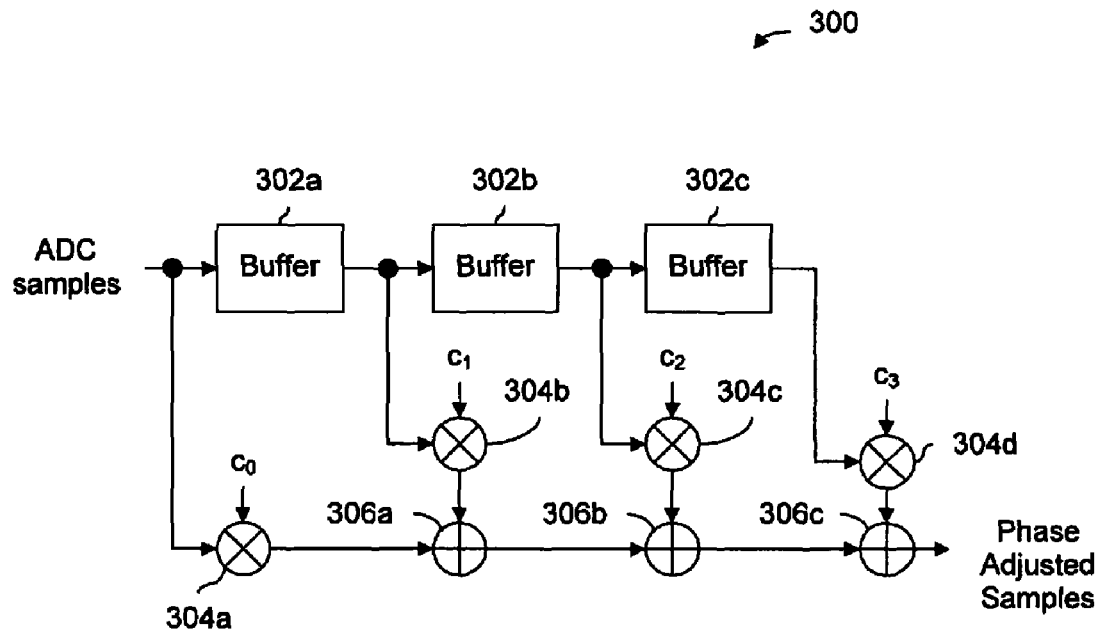
FIG. 3A is a diagram showing an embodiment of a phase adjust filter.

FIG. 3A is a diagram showing an embodiment of a phase adjust filter. In some embodiments, phase adjust filter 104 in FIG. 1 includes phase adjust filter 300. In some other embodiments, phase adjust filter 104 in FIG. 1 is implemented differently. In this particular example, a current ADC sample is "helped" by the previous 3 ADC samples. In some other embodiments, some other number of samples is combined to generate a phase adjusted sample.

Phase adjust filter 300 includes buffers 302a-302c which are configured to store ADC samples passed to it. An ADC sample is input to buffer 302a, the output of which is connected to the input of buffer 302b; the output of buffer 302b is connected to the input of buffer 302c. As each new ADC sample is input, the ADC samples are shifted forward through the array of buffers 302a-302c. The outputs of buffers 302a-302c are respectively coupled to multipliers 304b-304d. A fourth multiplier (304a) receives as one of its inputs the input ADC sample. Multipliers 304a-304d each multiply a respective ADC sample with a respective coefficient: multiplier 304a multiplies by $c_0$, multiplier 304b multiplies by $c_1$, multiplier 304c multiplies by $c_2$, and multiplier 304d multiplies by $c_3$. The outputs of multipliers 304a and 304b are passed to adder 306a, the output of which is passed to adder 306b which adds it to the output of multiplier 304c. The output of adder 306b is passed to adder 306c which adds it to the output of multiplier 304d. Adder 306c outputs phase adjusted samples.

The following figures show some example data being processed by phase adjust filter 300 at various points in time to illustrate how the exemplary system operates.

Figure 3B:
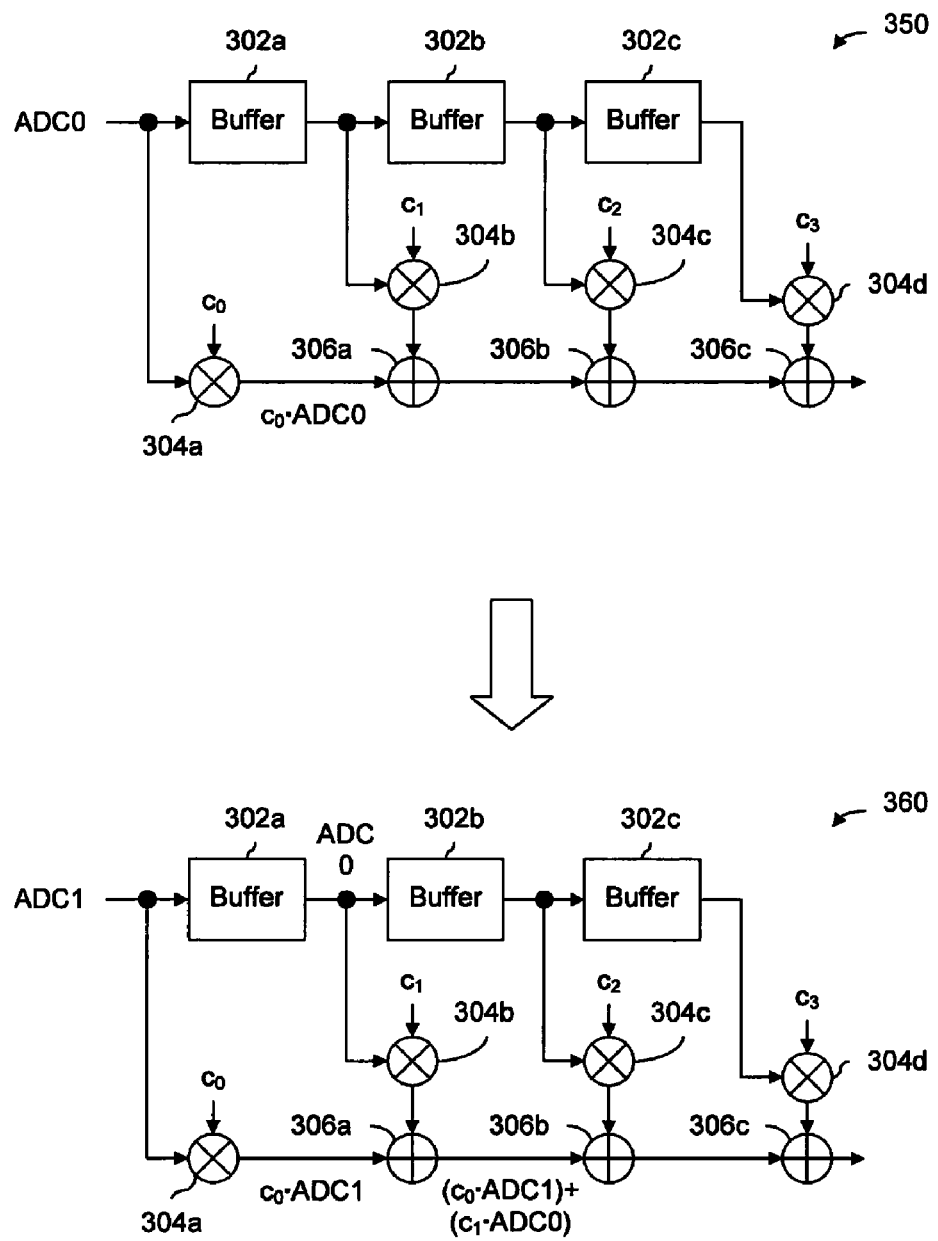
FIG. 3B is a diagram showing an embodiment of a phase adjust filter at a first point in time and a second point in time.

FIG. 3B is a diagram showing an embodiment of a phase adjust filter at a first point in time and a second point in time. In the example shown, diagram 350 shows system 300 at a first point in time. An ADC sample (ADC0) is passed to the system and is at the input of buffer 302a.

Diagram 360 shows system 300 at a second point in time. The next ADC sample (ADC1) has been passed to the phase adjust filter and is at the input of buffer 302a. ADC0 has been shifted forward to the output of buffer 302a. The output of multiplier 304a is $c_0$·ADC1 and the output of multiplier 304b is $c_1$·ADC0.

Figure 3C:
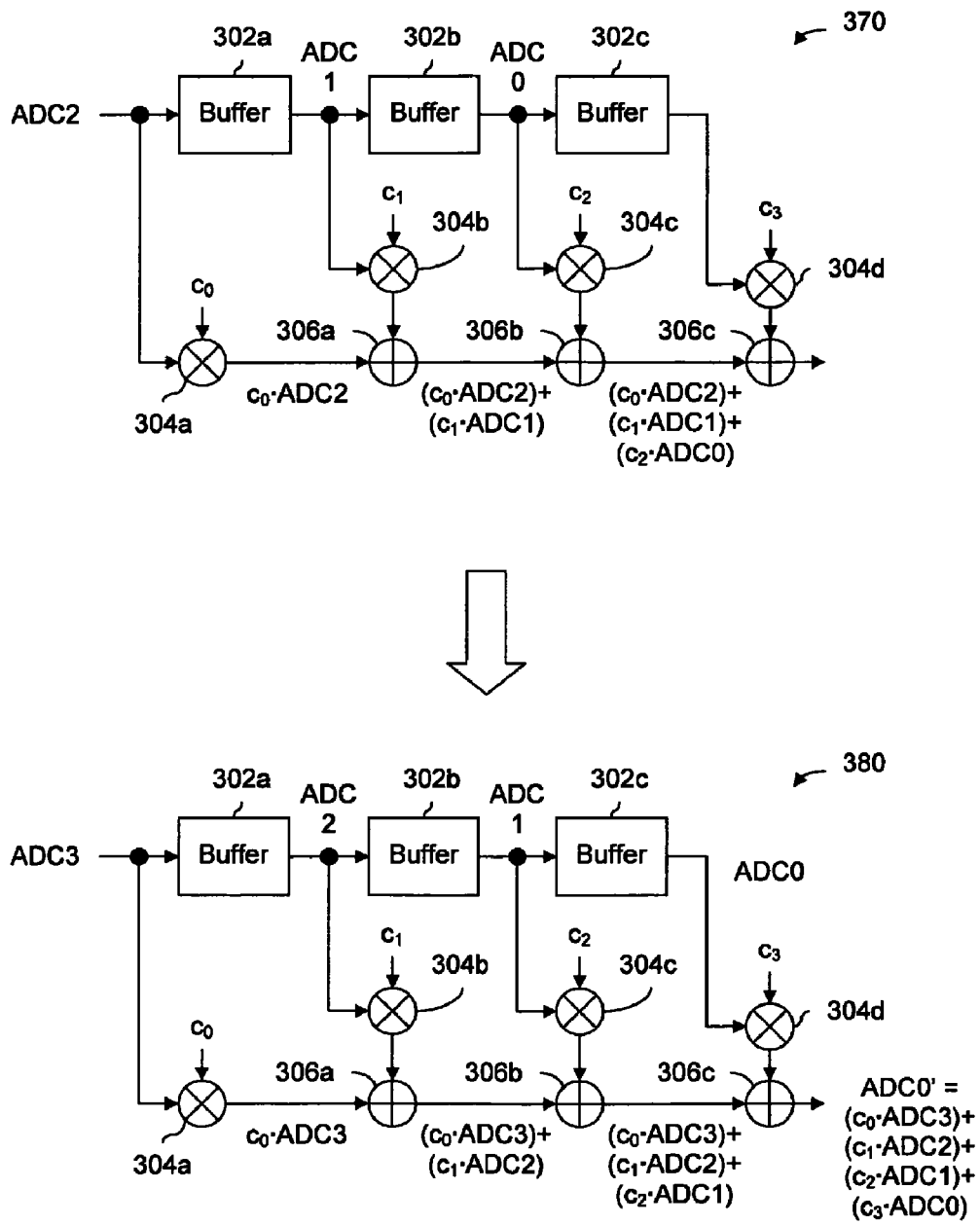
FIG. 3C is a diagram showing an embodiment of a phase adjust filter at a third point in time and a fourth point in time. In the example shown, diagram 370 shows system 300 at a third point in time.

FIG. 3C is a diagram showing an embodiment of a phase adjust filter at a third point in time and a fourth point in time. In the example shown, diagram 370 shows system 300 at a third point in time. A third ADC sample (ADC2) has been received by the phase adjust filter and is located at the input of buffer 302a. The older ADC samples have been shifted forward along the buffer array and ADC1 is located at the output of buffer 302a and ADC0 is located at the output of buffer 302b. The output of multiplier 304a is $c_0$·ADC2, the output of adder 306a is ($c_0$·ADC2)+($c_1$·ADC1), and the output of adder 306b is ($c_0$·ADC2)+($c_1$·ADC1)+($c_2$·ADC0).

Diagram 380 shows system 300 at a fourth point in time. At this point in time, the next ADC sample (ADC3) has been received by the system. ADC2-ADC0 are output by buffers 302a-302c, respectively. The output of multiplier 304a is $c_0$·ADC3, the output of adder 306a is ($c_0$·ADC3)+($c_1$·ADC2), and the output of adder 306b is ($c_0$·ADC3)+($c_1$·ADC2)+($c_2$·ADC1). The output of adder 306c is a phase adjusted sample and is:

$$ADC0'=(c_0 \cdot ADC3)+(c_1 \cdot ADC2)+(c_2 \cdot ADC1)+(c_3 \cdot ADC0)$$

Figure 3D:
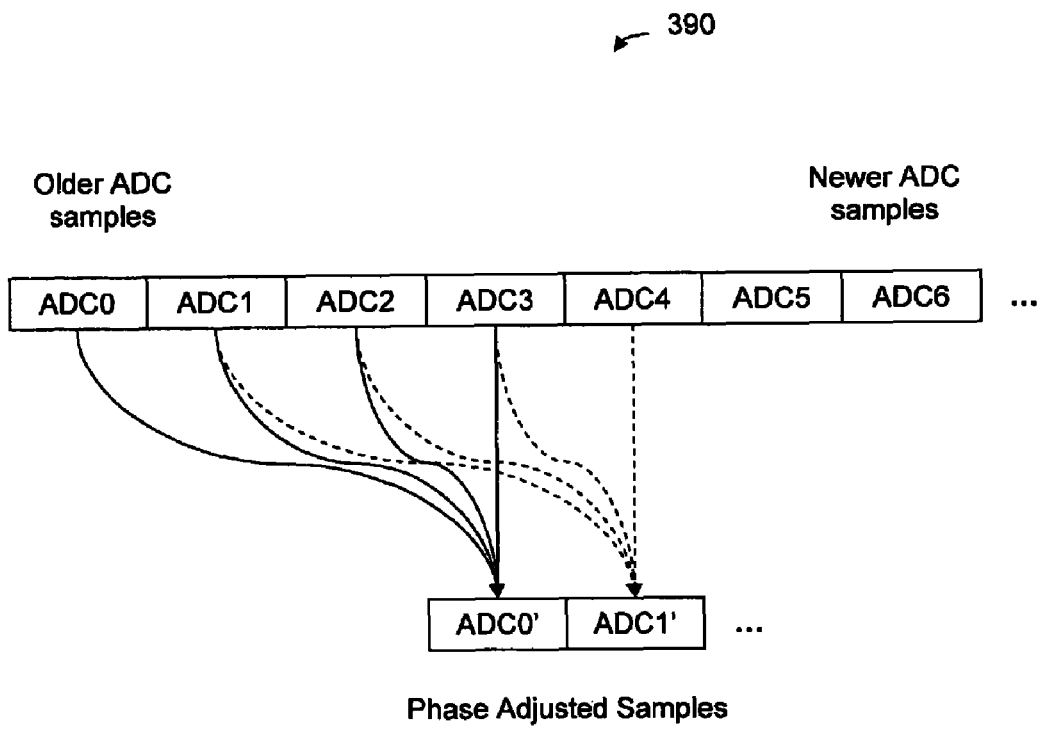
FIG. 3D is a diagram showing an embodiment of which ADC samples contribute to which phase adjusted samples.

FIG. 3D is a diagram showing an embodiment of which ADC samples contribute to which phase adjusted samples. In this example, each phase adjusted sample is based on four ADC samples. Phase adjusted sample ADC0' is based on ADC samples ADC0-ADC3, phase adjusted sample ADC1' is based on ADC samples ADC1-ADC4, and so on. For clarity, the ADC samples that contribute to phase adjusted sample ADC0' are shown with unbroken lines and the ADC samples that contribute to phase adjusted sample ADC1' are shown with dashed lines.

In diagram 390, the relationships shown are specific to phase adjust filter 300 of FIGS. 3A-3C. Some other phase adjust filters are configured to generate phase adjusted samples in some other combination or manner and the relationships between ADC samples and phase adjusted samples shown herein is merely exemplary.

In some embodiments, the coefficients $c_0$-$c_3$ in FIG. 3A-3C are selected based at least in part on a phase estimated or calculated from the ADC samples. In one example, a phase is estimated using the equation:

$$\phi = \tan^{-1}\left(\frac{ADC0 - ADC2}{ADC1 - ADC3}\right)$$

where ADC0 is the oldest sample in the group and ADC3 is the newest sample in the group. In some embodiments, the ADC samples used in the above equation to calculate a phase are from a preamble (e.g., that has fixed or known values). In some embodiments, coefficients (e.g., $c_0$-$c_3$ in FIG. 3A-3C) are stored in a lookup table. In one example, a calculated phase (e.g., calculated using the above equation) is passed to a lookup table that stores coefficients. Based on the calculated phase passed to the lookup table, one or more coefficients (e.g., the values of $c_0$-$c_3$ in FIGS. 3A-3C) are output in such embodiments. For example, there may be some known or desired phase and if the calculated phase passed to the lookup table is greater than (less than) the desired phase then appropriate coefficients are output.

In some embodiments, gain adjustment is performed in addition to phase adjustment using the filtering. This can be implemented in a variety of ways and two such ways are shown below as examples. In the first embodiment, a separate gain adjustment block (placed before the filter that performs phase adjustment) is used. In the second embodiment, the filter that performs phase adjustment is also configured to perform gain adjustment.

Figure 4:
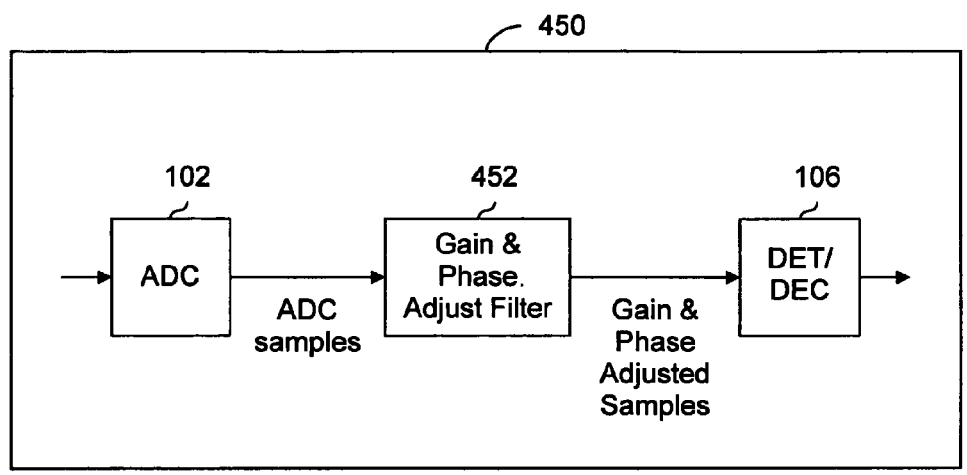
FIG. 4 is a diagram showing an embodiment of a system configured to perform gain and phase adjustment.

FIG. 4 is a diagram showing an embodiment of a system configured to perform gain and phase adjustment. In this example, a (e.g., single) filter is configured to perform both gain and phase adjustment. ADC samples are passed from ADC 102 to gain and phase adjust filter 452 which outputs samples that are both gain and phase adjusted. In some embodiments, filter 452 is an FIR filter.

Figure 5:
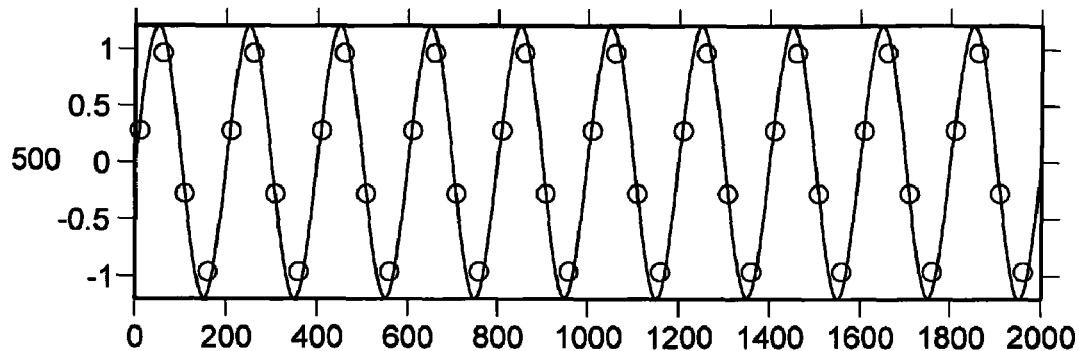
FIG. 5 is a diagram showing an embodiment of signals before and after gain and phase adjustment.
Figure 5:
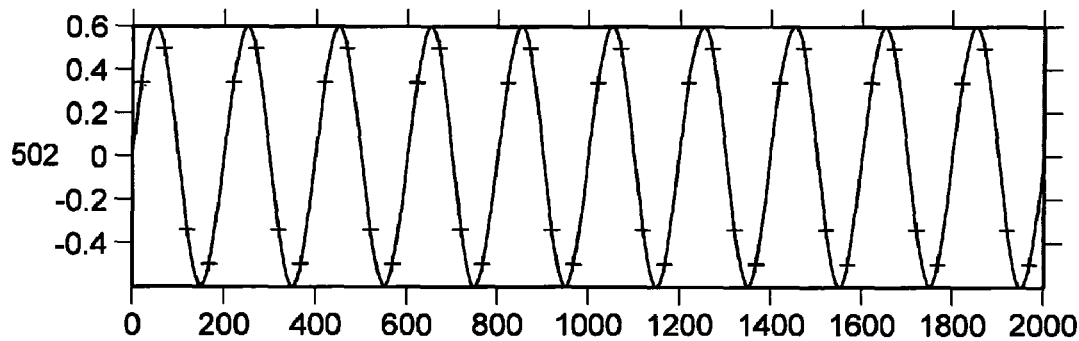
Figure 5:
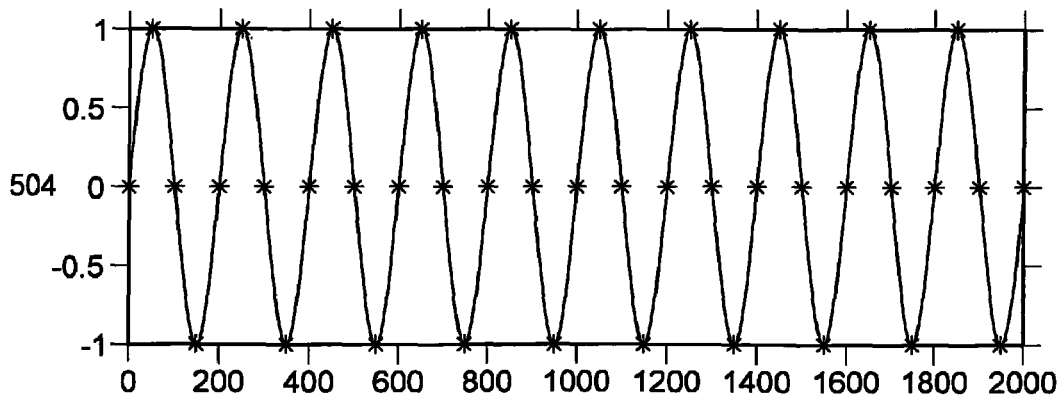

FIG. 5 is a diagram showing an embodiment of signals before and after gain and phase adjustment. In the example shown, two input signals are shown and one output signal is shown. The first input signal (500) has a phase that is "late" compared to a desired phase and an amplitude that is larger than desired. Signal 500 ranges from approximately ±1.25 in these examples and the desired range is ±1.0. The second input waveform shown (502) has a phase that is "late" compared to a desired or ideal phase and has a range of ±0.6. Output signal 504 shows the example inputs when corrected for phase and gain. The signal shown in 504 ranges between ±1.0 and has had its phase adjusted (e.g., to be at 0, π/2, π, etc.).

Figure 6:
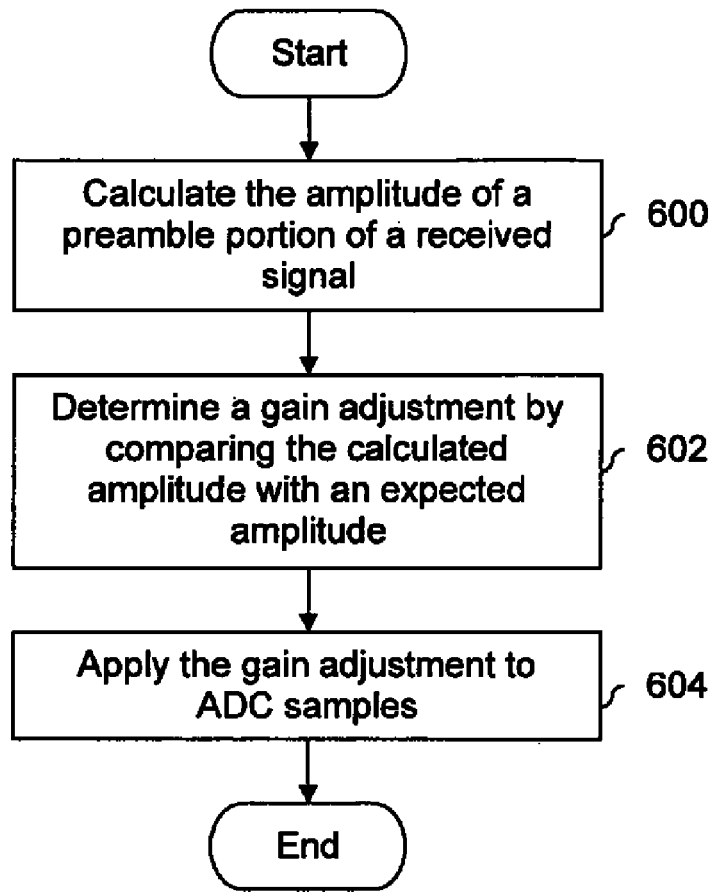
FIG. 6 is a flowchart illustrating an embodiment of a process for performing gain adjustment.

FIG. 6 is a flowchart illustrating an embodiment of a process for performing gain adjustment. In some embodiments, gain adjustment block 402 shown in FIG. 4A performs the process describe here. At 600, the amplitude of a preamble portion of a received signal is calculated. For example, in a packet transmitted over a channel or sector stored in storage media, there may be a preamble portion followed by a data portion. (In some cases, there may be one or more fields between the preamble and data portion.) A gain adjustment is determined by comparing the calculated amplitude with an expected amplitude at 602. For example, a preamble has a known pattern or sequence and the expected amplitude is therefore known. The gain adjustment is applied to ADC samples at 604. For example, if the calculated amplitude is less than an expected amplitude for the preamble portion, then the data portion is similarly scaled up.

In some embodiments, the technique of adjusting phase using a filter is used for certain types of data. In some embodiments, other types of data are processed using some other technique (e.g., phase and/or frequency is adjusted using a timing loop). One exemplary type of data processed by a phase adjust filter is described below.

Figure 7:
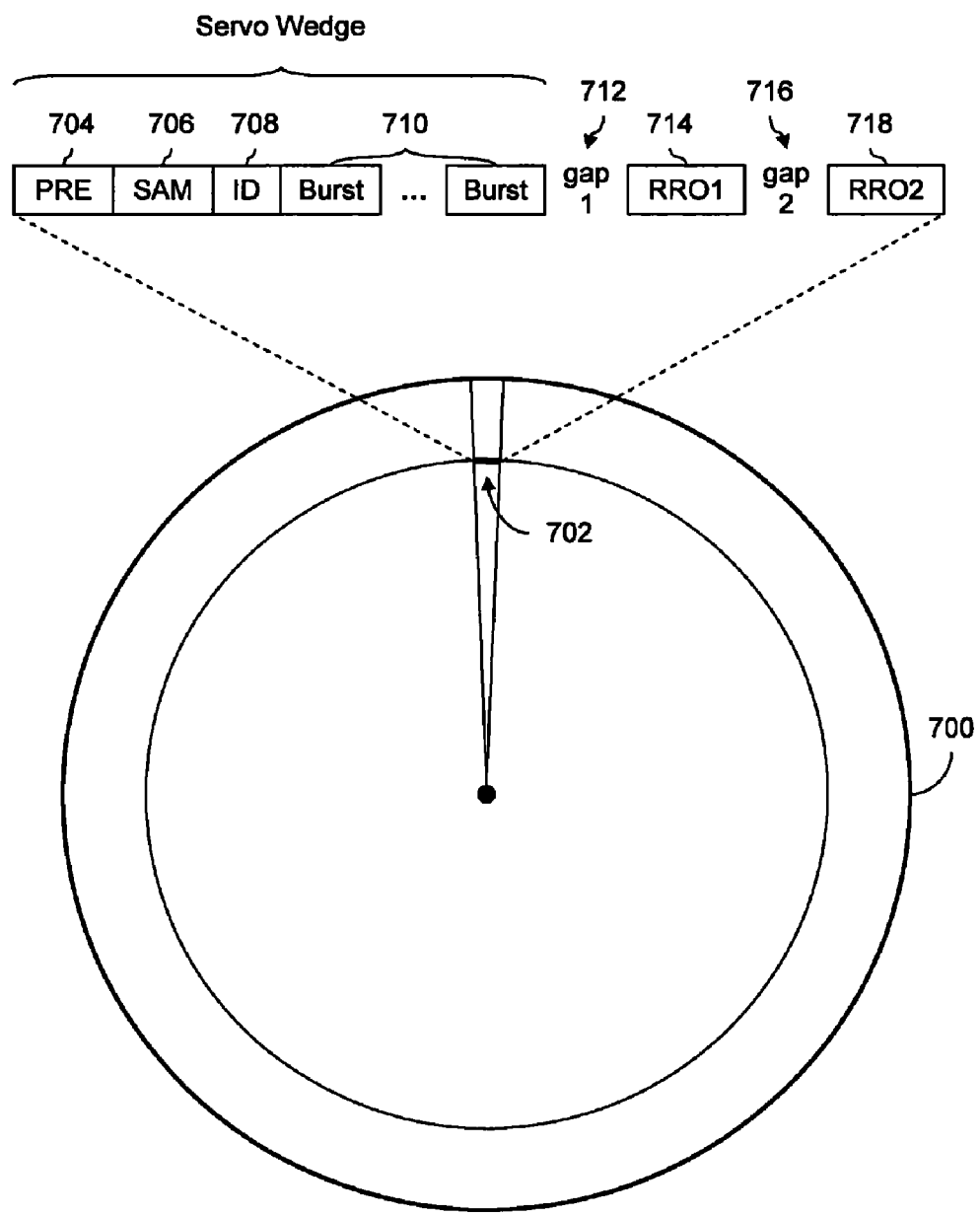
FIG. 7 is a diagram showing an embodiment of a servo wedge.

FIG. 7 is a diagram showing an embodiment of a servo wedge. In the example shown, segment 702 is located on disk 700 and includes a servo wedge followed by two repeatable runout (RRO) segments. Disk 700 includes a plurality of servo wedges, one of which is shown. Servo wedges are used to store overhead data as opposed to user data. Servo wedge 700 includes preamble 704, Servo Address Mark (SAM) 706, ID field 708, one or more burst fields 710, a first gap (712), a RRO segment (714), a second gap 716, and a second RRO segment (718).

In some embodiments, an RRO segment includes a preamble portion and a data portion and the phase and/or gain adjustment techniques described herein are used at least on the preamble portion of an RRO segment. In some embodiments, non-RRO data is processed using some other technique (e.g., using a timing loop).

In some embodiments, a timing loop is used to perform frequency and/or phase adjustment for a beginning portion of a servo wedge and a filter is used to perform phase adjustment (and optionally also gain adjustment) for an RRO segment. In this figure for example, preamble 704 thru burst 710 are processed using a timing loop and RRO data 714 and 718 are processed using a filter in some embodiments.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system for adjusting phase, comprising:
   an analog to digital converter configured to convert an analog signal to a plurality of digital samples; and
   a phase adjust filter configured to adjust the phase of the plurality of digital samples to obtain a plurality of phase adjusted samples having a phase corresponding to a desired phase, wherein the adjustment is based at least in part on one or more of the plurality of digital samples.

2. The system of claim 1 further comprising an error correction decoder configured to perform error correction decoding on the plurality of phase adjusted samples.

3. The system of claim 1, wherein the filter includes a finite impulse response (FIR) filter.

4. The system of claim 1 further comprising a processor configured to select a coefficient for the filter.

5. The system of claim 4, wherein the processor is further configured to calculate a phase using at least some of the plurality of digital samples and selecting a coefficient for the filter is based at least in part on the calculated phase.

6. The system of claim 5, wherein the processor is further configured to pass the calculated phase to a lookup table which is configured to return a coefficient to the processor in response to receiving the calculated phase.

7. The system of claim 1, wherein the filter is further configured to adjust the gain of the plurality of digital samples and the plurality of phase adjusted samples output by the filter are adjusted for both gain and phase.

8. The system of claim 7 further comprising a processor configured to calculate an amplitude of a preamble and determine a gain adjustment based at least in part on the amplitude of the preamble, wherein the gain adjustment is used by the filter to adjust the gain of the plurality of digital samples.

9. The system of claim 1, wherein the analog signal includes data stored in a repeatable runout (RRO) field included in a servo wedge.

10. The system of claim 1, wherein the phase adjust filter is configured to adjust the phase at least in part by adjusting a current digital sample based at least in part on one or more previous digital samples received prior to the current digital sample.

11. A method for adjusting phase, comprising:
    using an analog to digital converter to convert an analog signal to a plurality of digital samples; and
    using a phase adjust filter to adjust the phase of the plurality of digital samples to obtain a plurality of phase adjusted samples having a phase corresponding to a desired phase, wherein the adjustment is based at least in part on one or more of the plurality of digital samples.

12. The method of claim 11 further comprising performing error correction decoding on the plurality of phase adjusted samples.

13. The method of claim 11, wherein the filter includes a finite impulse response (FIR) filter.

14. The method of claim 11 further comprising selecting a coefficient for the filter.

15. The method of claim 14 further comprising calculating a phase using at least some of the plurality of digital samples, wherein selecting a coefficient for the filter is based at least in part on the calculated phase.

16. The method of claim 15 further comprising passing the calculated phase to a lookup table which is configured to return a coefficient in response to receiving the calculated phase.

17. The method of claim 11 further comprising using the filter to adjust the gain of the plurality of digital samples, wherein the plurality of phase adjusted samples output by the filter are adjusted for both gain and phase.

18. The method of claim 17 further comprising calculating an amplitude of a preamble and determining a gain adjustment based at least in part on the amplitude of the preamble, wherein the gain adjustment is used by the filter to adjust the gain of the plurality of digital samples.

19. The method of claim 11, wherein the analog signal includes data stored in a repeatable runout (RRO) field included in a servo wedge.

20. The method of claim 11, wherein filtering includes adjusting the phase at least in part by adjusting a current digital sample based at least in part on one or more previous digital samples received prior to the current digital sample.

* * * * *